United States Patent
Yoo et al.

(10) Patent No.: US 9,172,011 B2
(45) Date of Patent: Oct. 27, 2015

(54) COMPOSITION FOR ENCAPSULANT, ENCAPSULANT, AND ELECTRONIC DEVICE

(71) Applicants: Hong-Jung Yoo, Uiwang-si (KR); Woo-Han Kim, Uiwang-si (KR); Ha-Neul Kim, Uiwang-si (KR); Chi-Won An, Uiwang-si (KR); Eun-Seon Lee, Uiwang-si (KR); Dong-il Han, Uiwang-si (KR)

(72) Inventors: Hong-Jung Yoo, Uiwang-si (KR); Woo-Han Kim, Uiwang-si (KR); Ha-Neul Kim, Uiwang-si (KR); Chi-Won An, Uiwang-si (KR); Eun-Seon Lee, Uiwang-si (KR); Dong-il Han, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/142,295

(22) Filed: Dec. 27, 2013

(65) Prior Publication Data

US 2014/0187734 A1    Jul. 3, 2014

(30) Foreign Application Priority Data

Dec. 28, 2012    (KR) .................... 10-2012-0157565

(51) Int. Cl.
  *C08G 77/12*    (2006.01)
  *H01L 33/56*    (2010.01)
  *C09J 183/10*    (2006.01)

(52) U.S. Cl.
  CPC .............. *H01L 33/56* (2013.01); *C09J 183/10* (2013.01); *H01L 2224/48091* (2013.01)

(58) Field of Classification Search
  CPC ........ C08G 77/12; C08G 77/20; C08G 77/14; H01L 33/56

USPC ..................................................... 528/31, 32
  See application file for complete search history.

(56) References Cited

U.S. PATENT DOCUMENTS

| 4,912,188 | A | * | 3/1990 | Colas et al. ..................... 528/15 |
| 5,051,467 | A | * | 9/1991 | Okinoshima et al. ......... 524/731 |
| 5,468,826 | A |   | 11/1995 | Gentle et al. |
| 2009/0203837 | A1 |   | 8/2009 | Morita et al. |
| 2009/0294796 | A1 | * | 12/2009 | Morita et al. ................. 257/100 |
| 2010/0063185 | A1 |   | 3/2010 | Morita et al. |
| 2012/0016083 | A1 |   | 1/2012 | Kim et al. |

FOREIGN PATENT DOCUMENTS

| CN | 101443400 A | 5/2009 |
| JP | 08-143672 A | 6/1996 |
| JP | 2007-327019 A | 12/2007 |
| JP | 2012-233153 A | 11/2012 |
| KR | 10-2009-0099060 A | 9/2009 |
| KR | 10-2012-007401 A | 1/2012 |
| KR | 10-2012-0078614 A | 7/2012 |
| KR | 10-2012-0125194 A | 11/2012 |
| TW | 201035245 A1 | 10/2010 |

OTHER PUBLICATIONS

JP 2012 233153 machine translation (2013).*

* cited by examiner

*Primary Examiner* — Kuo-Liang Peng
(74) *Attorney, Agent, or Firm* — Lee & Morse, P.C.

(57) ABSTRACT

A composition for an encapsulant, an encapsulant, and an electronic device, the composition including an adhesion-promoting agent, the adhesion-promoting agent including an epoxy group in an amount of about 2.0 to about 5.0 mmol/g, at least one first polysiloxane that includes a hydrogen bound to a silicon at a terminal end thereof, and at least one second polysiloxane that includes an alkenyl group bound to a silicon at a terminal end thereof.

8 Claims, 1 Drawing Sheet

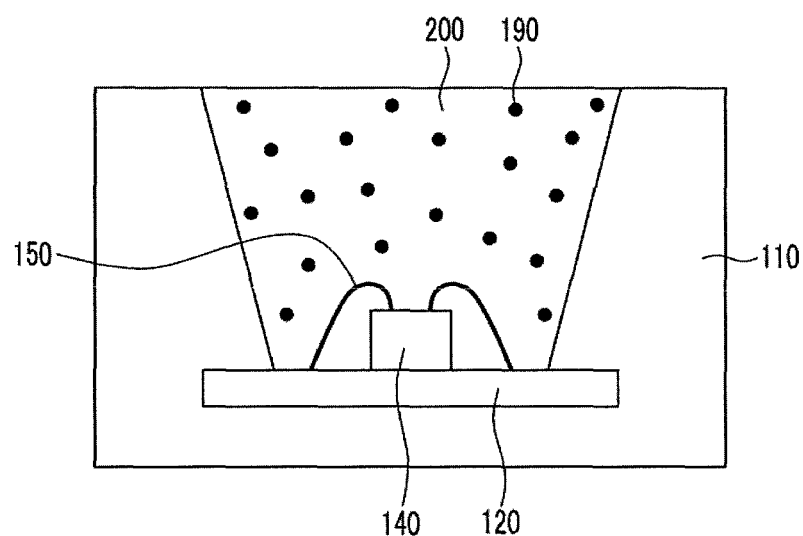

COMPOSITION FOR ENCAPSULANT, ENCAPSULANT, AND ELECTRONIC DEVICE

CROSS-REFERENCE TO RELATED APPLICATION

Korean Patent Application No. 10-2012-0157565, filed on Dec. 28, 2012, in the Korean Intellectual Property Office, and entitled: "Composition For Encapsulant and Encapsulant and Electronic Device," is incorporated by reference herein in its entirety.

BACKGROUND

1. Field

Embodiments relate to a composition for an encapsulant, an encapsulant, and an electronic device.

2. Description of the Related Art

A light emitting device, e.g., a light emitting diode (LED), an organic light emitting device (OLED), a photoluminescent (PL) device, or the like, may be applied to, e.g., a domestic electric device, a lighting device, a display device, various automatic devices, or the like. The light emitting device may display intrinsic colors of a light emitting material, e.g., blue, red, and green in a light emission part, or white by combining light emitters displaying different colors. Such a light emitting device may include an encapsulant having a packaging or encapsulation structure.

SUMMARY

Embodiments are directed to a composition for an encapsulant, an encapsulant, and an electronic device.

The embodiments may be realized by providing a composition for an encapsulant, the composition including an adhesion-promoting agent represented by the following Chemical Formula 1, the adhesion-promoting agent including an epoxy group in an amount of about 2.0 to about 5.0 mmol/g, at least one first polysiloxane that includes a hydrogen bound to a silicon at a terminal end thereof, and at least one second polysiloxane that includes an alkenyl group bound to a silicon at a terminal end thereof,

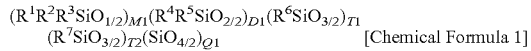

[Chemical Formula 1]

wherein, in the above Chemical Formula 1, $R^1$ to $R^7$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, an epoxy group-containing group, a substituted or unsubstituted C1 to C30 carbonyl group, or a combination thereof, at least one of $R^1$ to $R^7$ is an epoxy group-containing group, $0 \leq M1 < 1$, $0 < D1 < 1$, $0 \leq T1 < 1$, $0 \leq T2 < 1$, $0 \leq Q1 < 1$, and $M1+D1+T1+T2+Q1=1$.

At least one of $R^4$ or $R^5$ may be an epoxy group-containing group.

At least one of $R^1$ to $R^7$ may be hydrogen or a substituted or unsubstituted C2 to C30 alkenyl group.

The composition may include an epoxy group in an amount of about 0.100 to about 0.250 mmol/g.

The adhesion-promoting agent may be included in the composition in an amount of about 0.5 to about 10 wt %, based on a total weight of the composition.

The first polysiloxane may be represented by the following Chemical Formula 2:

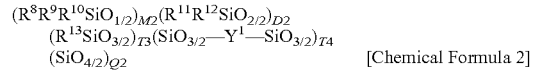

[Chemical Formula 2]

wherein, in the above Chemical Formula 2, $R^8$ to $R^{13}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^8$ to $R^{13}$ is hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0 < M2 < 1$, $0 \leq D2 < 1$, $0 \leq T3 < 1$, $0 \leq T4 < 1$, $0 \leq Q2 < 1$, and $M2+D2+T3+T4+Q2=1$.

The second polysiloxane may be represented by the following Chemical Formula 3:

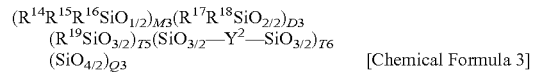

[Chemical Formula 3]

wherein in the above Chemical Formula 3, $R^{14}$ to $R^{19}$ are each independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{14}$ to $R^{19}$ is a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0 < M3 < 1$, $0 \leq D3 < 1$, $0 \leq T5 < 1$, $0 \leq T6 < 1$, $0 \leq Q3 < 1$, and $M3+D3+T5+T6+Q3=1$.

The composition may include about 10 to about 40 wt % of the first polysiloxane, and about 60 to about 90 wt % of the second polysiloxane, all amounts being based on a total weight of the composition.

The embodiments may also be realized by providing a composition for an encapsulant, the composition including an adhesion-promoting agent represented by the following Chemical Formula 1, at least one first polysiloxane that includes a hydrogen bound to a silicon at a terminal end thereof, and at least one second polysiloxane that includes an alkenyl group bound to a silicon at a terminal end thereof, wherein the composition includes an epoxy group in an amount of about 0.100 to about 0.250 mmol/g,

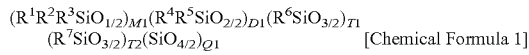
[Chemical Formula 1]

wherein, in the above Chemical Formula 1, $R^1$ to $R^7$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, an epoxy group-containing group, a substituted or unsubstituted C1 to C30 carbonyl group, or a combination thereof, at least one of $R^1$ to $R^7$ is an epoxy group-containing group, $0 \leq M1 < 1$, $0 < D1 < 1$, $0 \leq T1 < 1$, $0 \leq T2 < 1$, $0 \leq Q1 < 1$, and $M1+D1+T1+T2+Q1=1$.

At least one of $R^4$ or $R^5$ may be an epoxy group-containing group.

At least one of $R^1$ to $R^7$ may be hydrogen or a substituted or unsubstituted C2 to C30 alkenyl group.

The adhesion-promoting agent may be included in the composition in an amount of about 0.5 to about 10 wt %, based on a total weight of the composition.

The first polysiloxane may be represented by the following Chemical Formula 2:

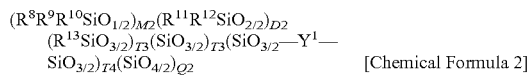
[Chemical Formula 2]

wherein, in the above Chemical Formula 2, $R^8$ to $R^{13}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^8$ to $R^{13}$ is hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M2<1$, $0 \leq D2<1$, $0 \leq T3<1$, $0 \leq T4<1$, $0 \leq Q2<1$, and $M2+D2+T3+T4+Q2=1$.

The second polysiloxane may be represented by the following Chemical Formula 3:

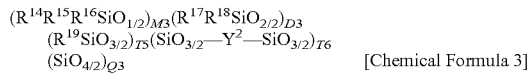
[Chemical Formula 3]

wherein, in the above Chemical Formula 3, $R^{14}$ to $R^{19}$ are each independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{14}$ to $R^{19}$ is a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M3<1$, $0 \leq D3<1$, $0 \leq T5<1$, $0 \leq T6<1$, $0 \leq Q3<1$, and $M3+D3+T5+T6+Q3=1$.

The composition may include about 10 to about 40 wt % of the first polysiloxane, and about 60 to about 90 wt % of the second polysiloxane, all amounts being based on a total weight of the composition for an encapsulant.

The embodiments may also be realized by providing an encapsulant obtained by curing the composition for an encapsulant according to an embodiment.

The embodiments may also be realized by providing an electronic device including the encapsulant according to an embodiment.

BRIEF DESCRIPTION OF THE DRAWING

Features will be apparent to those of skill in the art by describing in detail exemplary embodiments with reference to the attached drawing in which:

FIG. 1 illustrates a schematic cross-sectional view of a light emitting diode according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, when a definition is not otherwise provided, the term "substituted" may refer to one substituted with at least a substituent selected from a halogen atom (e.g., F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

As used herein, when a definition is not otherwise provided, the prefix "hetero" may refer to one including 1 to 3 heteroatoms selected from N, O, S, and P.

Hereinafter, a composition for an encapsulant according to an embodiment is described.

A composition for an encapsulant according to an embodiment may include an adhesion-promoting agent represented by the following Chemical Formula 1, at least one first polysiloxane that includes a hydrogen bound to a silicon (Si—H) at a terminal end thereof, and at least one second polysiloxane that includes an alkenyl group bound to a silicon (e.g., Si—Vi) at a terminal end thereof.

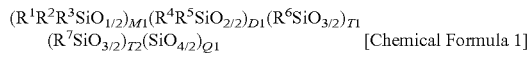
[Chemical Formula 1]

In the above Chemical Formula 1, $R^1$ to $R^7$ may each independently be hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, an epoxy group-containing group (e.g., an epoxy group-containing organic group), a substituted or unsubstituted C1 to C30 carbonyl group, or a combination thereof.

In an implementation, at least one of $R^1$ to $R^7$ may be an epoxy group-containing group.

In Formula 1, $0 \leq M1 < 1$, $0 < D1 < 1$, $0 \leq T1 < 1$, $0 \leq T2 < 1$, $0 \leq Q1 < 1$, and $M1+D1+T1+T2+Q1=1$.

The epoxy group-containing may be, e.g., an epoxy group-containing C1 to C30 alkyl group, an epoxy group-containing C3 to C30 cycloalkyl group, an epoxy group-containing C6 to C30 aryl group, an epoxy group-containing C7 to C30 arylalkyl group, an epoxy group-containing C1 to C30 heteroalkyl group, an epoxy group-containing C2 to C30 heterocycloalkyl group, or a combination thereof. In an implementation, the epoxy group-containing group may be, e.g., a glycidoxyalkyl group such as a glycidoxypropyl group.

The epoxy group-containing group may be positioned in or on a chain structure or backbone of a siloxane moiety of the above Chemical Formula 1. For example, at least one of $R^4$ or $R^5$ in the above Chemical Formula 1 may be or may include the epoxy group-containing group.

The adhesion-promoting agent represented by the above Chemical Formula 1 may include an epoxy group in an amount of about 2.0 to about 5.0 mmol/g. Including the epoxy group within the described amount may help increase adherence or adhesion of an encapsulant to a lower substrate, and may help secure light transmittance and simultaneously, may help increase a density of the encapsulant and attain satisfactory heat resistance, moisture permeability, and oxygen permeability. For example, maintaining the amount of the epoxy group in the adhesion-promoting agent at about 2.0 mmol/g or greater may help prevent the encapsulant from being detached or delaminated due to weak adhesion to a lower substrate, and may help prevent a deterioration in heat resistance, moisture permeability, and oxygen permeability of the encapsulant. Maintaining the amount of the epoxy group in the adhesion-promoting agent at about 5.0 mmol/g or less may help prevent a sharp deterioration in transmittance of the encapsulant before and after curing. Thus, the encapsulant may help ensure good photo efficiency of a light emitting device, when applied to the light emitting device.

An amount of the epoxy group included in the composition may be about 0.100 to about 0.250 mmol/g, based on a total weight of the composition for an encapsulant.

In the above Chemical Formula 1, at least one of $R^1$ to $R^7$ (positioned at the terminal end) may be or may include hydrogen or a substituted or unsubstituted C2 to C30 alkenyl group. The hydrogen or substituted or unsubstituted C2 to C30 alkenyl group positioned at the terminal end, may react with the first polysiloxane or second polysiloxanes which will be described below.

In the above Chemical Formula 1, at least one of $R^4$ to $R^7$ may include a substituted or unsubstituted C6 to C20 aryl group. A refractive index may increase due to the substituted or unsubstituted C6 to C20 aryl group.

The adhesion-promoting agent may be included in the composition in an amount of about 0.5 to about 10 wt %, based on a total weight of the composition for an encapsulant. When the adhesion-promoting agent is included within the range, heat resistance, moisture permeability, and oxygen permeability, as well as adhesion of the encapsulant to a lower substrate may be effectively improved. In an implementation, the adhesion-promoting agent may be included in an amount of about 1 wt % to about 10 wt %.

One or more kinds of the adhesion-promoting agents may be used.

The first polysiloxane may be represented by the following Chemical Formula 2.

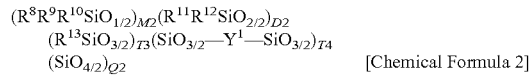
[Chemical Formula 2]

In the above Chemical Formula 2, $R^8$ to $R^{13}$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof.

In an implementation, at least one of $R^8$ to $R^{13}$ may be hydrogen.

$Y^1$ may be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

In Chemical Formula 2, $0 < M2 < 1$, $0 \leq D2 < 1$, $0 \leq T3 < 1$, $0 \leq T4 < 1$, $0 \leq Q2 < 1$, and $M2+D2+T3+T4+Q2=1$.

The first polysiloxane may be a compound that includes a hydrogen bound to a silicon (Si—H) at a terminal end thereof. For example, the first polysiloxane may include two or more hydrogen atoms bound to silicon atoms (Si—H) per molecule, on average. The hydrogen bound to silicon (Si—H) may react with the alkenyl group at a terminal end of the second polysiloxane and/or the alkenyl group at the terminal end of the adhesion-promoting agent.

The first polysiloxane may be obtained by hydrolysis and condensation polymerization of at least one selected from, e.g., a monomer represented by $R^8R^9R^{10}SiZ^1$, a monomer represented by $R^{11}R^{12}SiZ^2Z^3$, a monomer represented by $R^{13}SiZ^4Z^5Z^6$, a monomer represented by $Z^7Z^8Z^9Si$—$Y^1$—$SiZ^{10}Z^{11}Z^{12}$, or a monomer represented by $SiZ^{13}Z^{14}Z^{15}Z^{16}$. Herein, $R^8$ to $R^{13}$ may be the same as defined above, and $Z^1$ to $Z^{16}$ may each independently be a C1 to C6 alkoxy group, a hydroxy group, a halogen, a carboxyl group, or a combination thereof.

One or more kinds of the first polysiloxanes may be used.

The second polysiloxane may be represented by the following Chemical Formula 3.

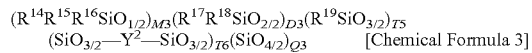  [Chemical Formula 3]

In the above Chemical Formula 3, $R^{14}$ to $R^{19}$ may each independently be a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof.

In an implementation, at least one of $R^{14}$ to $R^{19}$ may be or may include a substituted or unsubstituted C2 to C30 alkenyl group.

$Y^2$ may be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

In Chemical Formula 3, 0<M3<1, 0≤D3<1, 0≤T5<1, 0≤T6<1, 0≤Q3<1, and M3+D3+T5+T6+Q3=1.

The second polysiloxane may be a compound that includes an alkenyl group bound to a silicon (e.g., Si—Vi) at a terminal end thereof. For example, the second polysiloxane may include two or more alkenyl groups bound to silicon atoms (e.g., Si—Vi), on average. The alkenyl group bound to silicon (e.g., Si—Vi) may react with hydrogen at the terminal end of the first polysiloxane and/or hydrogen at the terminal end of the adhesion-promoting agent.

The second polysiloxane may be obtained by hydrolysis and condensation polymerization of at least one selected from, e.g., a monomer represented by $R^{14}R^{15}R^{16}SiZ^{17}$, a monomer represented by $R^{17}R^{18}SiZ^{18}Z^{19}$, a monomer represented by $R^{19}SiZ^{20}Z^{21}Z^{22}$, a monomer represented by $Z^{23}Z^{24}Z^{25}Si-Y^{2}-SiZ^{26}Z^{27}Z^{28}$, or a monomer represented by $SiZ^{29}Z^{30}Z^{31}Z^{32}$. Herein, $R^{14}$ to $R^{19}$ may be the same as defined above, and $Z^{17}$ to $Z^{32}$ may each independently be a C1 to C6 alkoxy group, a hydroxy group, a halogen, a carboxyl group, or a combination thereof.

One or more kinds of the second polysiloxane may be used.

The first polysiloxane and the second polysiloxane may each independently have a weight average molecular weight of about 100 to about 30,000 g/mol, e.g., about 100 to about 10,000 g/mol.

The first polysiloxane may be included in the composition in an amount of, e.g., about 10 to about 40 wt %, based on a total weight of the first polysiloxane and the second polysiloxane or based on the total weight of the composition. The second polysiloxane may be included in the composition in an amount of, e.g., about 60 to about 90 wt %, based on a total weight of the first polysiloxane and the second polysiloxane or based on the total weight of the composition.

In an implementation, the composition for an encapsulant may further include a filler. The filler may be made of or may include, e.g., an inorganic oxide such as silica, alumina, titanium oxide, zinc oxide, or a combination thereof.

In an implementation, the composition for an encapsulant may further include a hydrosilation catalyst.

The hydrosilation catalyst may accelerate a hydrosilation reaction of the first polysiloxane, the second polysiloxane, and the adhesion-promoting agent. The hydrosilation catalyst may include, e.g., platinum, rhodium, palladium, ruthenium, iridium, or a combination thereof. The hydrosilation catalyst may be included in an amount of, e.g., about 0.1 ppm to about 1,000 ppm, based on a total amount of the composition for an encapsulant.

The composition for an encapsulant may be cured by being heat-treated at a predetermined temperature and thus may be used as an encapsulant. The encapsulant may be applied to an electronic device, e.g., a light emitting diode or an organic light emitting device.

Hereinafter, as an example of an electronic device to which the encapsulant is applied, a light emitting diode according to one embodiment is described referring to FIG. 1.

FIG. 1 illustrates a schematic cross-sectional view of a light emitting diode according to an embodiment.

Referring to FIG. 1, the light emitting diode may include a mold 110; a lead frame 120 inside the mold 110; a light emitting diode chip 140 mounted on the lead frame 120; a bonding wire 150 connecting the lead frame 120 to the light emitting diode chip 140; and an encapsulant 200 covering the light emitting diode chip 140.

The encapsulant 200 may be obtained by curing the above composition for an encapsulant. The encapsulant 200 may be formed from the above composition for an encapsulant and may adhere to the mold 110, the lead frame 120, and the light emitting diode chip 140. Thus, occurrence of detachment or delamination may be decreased.

In an implementation, a phosphor 190 may be dispersed in the encapsulant 200. The phosphor 190 may include a material that is stimulated by light and that emits light in an intrinsic wavelength range. In an implementation, the phosphor 190 may include, e.g., a quantum dot such as a semiconductor nanocrystal. The phosphor 190 may include, e.g., a blue phosphor, a green phosphor, a red phosphor, or a mixture of more than two thereof.

The phosphor 190 may display an image in a predetermined wavelength region by light supplied from the light emitting diode chip 140 as a light emission part. For example, the light emitting diode chip 140 may display a color in a shorter wavelength region than a color displayed in the phosphor 190. For example, when the phosphor 190 displays red, the light emitting diode chip 140 may supply blue or green in a shorter wavelength region than that of the red.

In an implementation, the color from the light emitting diode chip 140 and the color from the phosphor 190 may be combined and thus white light may be displayed. For example, when the light emitting diode chip 140 supplies blue light, and the phosphor 190 includes a red phosphor and a green phosphor, the electronic device may combine blue, red, and green light and thus, may display white light.

In an implementation, the phosphor 190 may be omitted.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Adhesion-Promoting Agent

Synthesis Example 1

1 kg of a mixed solvent obtained by mixing water and toluene in a weight ratio of 5:5 was put in a 3-necked flask.

Then, 1 kg of another mixture including glycidoxypropylmethyldiethoxysilane, phenyltrimethoxysilane, and vinyltrimethoxysilane in a mole ratio of 30:45:25 along with a catalyst of CsOH was added to the mixed solvent in a dropwise fashion while the flask was maintained at 23° C. When the addition was complete, the resulting mixture was heated at 90° C. for 1 hour to start a condensation polymerization reaction. Subsequently, the resultant was cooled down to room temperature; a polymer solution dissolved in toluene was prepared by removing an aqueous layer therein. Then, the obtained polymer solution was washed with water, removing the catalyst. Subsequently the polymer solution was distilled under a reduced pressure to remove the toluene, obtaining a compound represented by the following Chemical Formula 4.

The compound represented by the above Chemical Formula 4 included 2.17 mmol/g of an epoxy group based on the NMR measurement result.

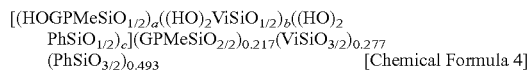

[Chemical Formula 4]

(OH: hydroxyl group, GP: glycidoxypropyl group, Me: methyl group, Vi: vinyl group, Ph: phenyl group, a≥0, b≥0, c≥0, and a+b+c=0.013)

Synthesis Example 2

A compound represented by the following Chemical Formula 5 was synthesized according to the same method as Synthesis Example 1 except for including glycidoxypropylmethyldiethoxysilane, phenyltrimethoxysilane, and vinyltrimethoxysilane in a mole ratio of 40:35:25.

The compound represented by the following Chemical Formula 5 included 3.05 mmol/g of an epoxy group based on the NMR measurement result.

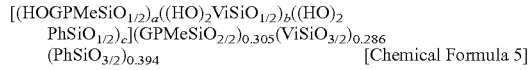

[Chemical Formula 5]

(OH: hydroxyl group, GP: glycidoxypropyl group, Me: methyl group, Vi: vinyl group, Ph: phenyl group, a≥0, b≥0, c≥0, a+b+c=0.015)

Synthesis Example 3

A compound represented by the following Chemical Formula 6 was synthesized according to the same method as Synthesis Example 1 except for using glycidoxypropylmethyldiethoxysilane, phenyltrimethoxysilane and vinyltrimethoxysilane in a ratio of 50:25:25.

The compound represented by the following Chemical Formula 6 included 3.87 mmol/g of an epoxy group based on the NMR measurement result.

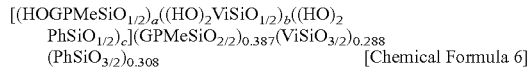

[Chemical Formula 6]

(OH: hydroxyl group, GP: glycidoxypropyl group, Me: methyl group, Vi: vinyl group, Ph: phenyl group, a≥0, b≥0, c≥0, a+b+c=0.017)

Synthesis Example 4

A compound the following represented by Chemical Formula 7 was synthesized according to the same method as Synthesis Example 1 except for using glycidoxypropylmethyldiethoxysilane, phenyltrimethoxysilane and vinyltrimethoxysilane in a mole ratio of 60:15:25.

The compound the following represented by Chemical Formula 7 included 4.56 mmol/g of an epoxy group based on the NMR measurement result.

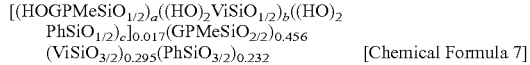

[Chemical Formula 7]

(OH: hydroxyl group, GP: glycidoxypropyl group, Me: methyl group, Vi: vinyl group, Ph: phenyl group, a≥0, b≥0, c≥0, a+b+c=0.017)

Synthesis Example 5

A compound represented by the following Chemical Formula 8 was synthesized according to the same method as Synthesis Example 1 except for using glycidoxypropylmethyldiethoxysilane, phenyltrimethoxysilane, and vinyltrimethoxysilane in a mole ratio of 70:5:25.

The compound represented by the following Chemical Formula 8 included 4.91 mmol/g of an epoxy group based on the NMR measurement result.

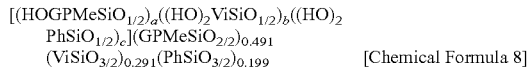

[Chemical Formula 8]

(OH: hydroxyl group, GP: glycidoxypropyl group, Me: methyl group, Vi: vinyl group, Ph: phenyl group, a≥0, b≥0, c≥0, a+b+c=0.019)

Comparative Synthesis Example 1

A compound represented by the following Chemical Formula 9 was synthesized according to the same method as Synthesis Example 1 except for using glycidoxypropylmethyldiethoxysilane, phenyltrimethoxysilane, and vinyltrimethoxysilane in a mole ratio of 20:55:25.

The compound represented by the following Chemical Formula 9 included 1.60 mmol/g of an epoxy group based on the NMR measurement result.

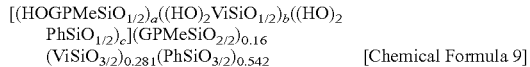

[Chemical Formula 9]

(OH: hydroxyl group, GP: glycidoxypropyl group, Me: methyl group, Vi: vinyl group, Ph: phenyl group, a≥0, b≥0, c≥0, a+b+c=0.017)

Comparative Synthesis Example 2

A compound represented by the following Chemical Formula 10 was synthesized according to the same method as Synthesis Example 1 except for using glycidoxypropylmethyldiethoxysilane, phenyltrimethoxysilane and vinyltrimethoxysilane in a mole ratio of 75:0:25.

The compound represented by the following Chemical Formula 10 included 5.16 mmol/g of an epoxy group based on the NMR measurement result.

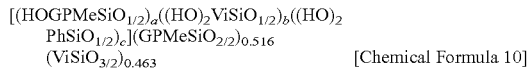

[Chemical Formula 10]

(OH: hydroxyl group, GP: glycidoxypropyl group, Me: methyl group, Vi: vinyl group, Ph: phenyl group, a≥0, b≥0, c≥0, a+b+c=0.021)

Synthesis of First and Second Polysiloxane

Synthesis Example 6

1 kg of a mixed solvent obtained by mixing water and toluene in a weight ratio of 5:5 was put in a 3-necked flask, and 166.11 g of another mixture prepared by mixing 159.39 g of phenyldichlorosilane and 6.72 g of tetramethyldisiloxane as a monomer was added thereto in a dropwise fashion for 2 hours while the flask was maintained at 23° C. When the addition was complete, the mixture was refluxed and heated at 90° C. for 3 hours to perform a condensation polymerization reaction. Subsequently, the resultant was cooled down to room temperature, and a polymer solution was prepared by removing an aqueous layer therefrom and dissolving it in toluene. The obtained polymer solution was washed to remove chlorine, a byproduct from the reaction. Subsequently, the neutral polymer solution was distilled under a reduced pressure to remove toluene, obtaining liquid polysiloxane.

As a result of measuring the molecular weight of the obtained polysiloxane was measured by using gel permeation chromatography, its polystyrene-reduced molecular weight was 950 g/mol, and the structure of Chemical Formula 2a was examined by using H-NMR, Si-NMR, and an elemental analyzer.

$(Me_2HSiO_{1/2})_{0.243}(PhHSiO_{2/2})_{0.757}$ [Chemical Formula 2a]

Synthesis Example 7

1 kg of a mixed solvent obtained by mixing water and toluene in a weight ratio of 5:5 was put in a 3-necked flask, and 300 g of another mixture of phenylmethyldichlorosilane, phenyltrichlorosilane, and vinyldimethylchlorosilane in an amount of respectively 10 mol %, 80 mol %, and 10 mol % as a monomer was added thereto in a dropwise fashion while the flask was maintained at 23° C. When the addition was complete, the mixture was heated and refluxed at 90° C. for 3 hours to perform a condensation polymerization reaction. Subsequently, the resultant was cooled down to room temperature, and a polymer solution was prepared by removing an aqueous layer therefrom and dissolving it in toluene. The obtained polymer solution was washed with water to remove chlorine, a byproduct from the reaction. Subsequently, the neutral polymer solution was distilled under a reduced pressure to remove toluene, obtaining liquid polysiloxane.

As a result of measuring molecular weight of the liquid polysiloxane by using gel permeation chromatography, its polystyrene-reduced molecular weight was 1050 g/mol, and the structure of Chemical Formula 3a was examined by using H-NMR, Si-NMR, and an elemental analyzer. Herein, the Me indicates a methyl group, the Vi a vinyl group, the Ph a phenyl group, and the Si silicon.

$(Me_2ViSiO_{1/2})_{0.152}(PhMeSiO_{2/2})_{0.332}(PhSiO_{3/2})_{0.516}$ [Chemical Formula 3a]

Preparation of Composition for Encapsulant

Example 1

5 wt % of the compound according to Synthesis Example 1, 25 wt % of the polysiloxane according to Synthesis Example 6, and 70 wt % of the compound according to Synthesis Example 7 were mixed with a hydrosilation catalyst, Pt-CS 1.8 (Umicore Inc.) (added up to a Pt content of 5 ppm), and the mixture was foam-removed under vacuum, preparing a composition for an encapsulant.

The composition for an encapsulant according to Example 1 included an epoxy group in an amount of 0.1085 mmol/g, based on the NMR measurement result.

Example 2

A composition for an encapsulant was prepared according to the same method as Example 1 except for using the compound according to Synthesis Example 2 instead of the compound according to Synthesis Example 1.

The composition for an encapsulant according to Example 2 included an epoxy group in an amount of 0.1525 mmol/g, based on the NMR measurement result.

Example 3

A composition for an encapsulant was prepared according to the same method as Example 1 except for using the compound according to Synthesis Example 3 instead of the compound according to Synthesis Example 1.

The composition for an encapsulant according to Example 3 included an epoxy group in an amount of 0.1935 mmol/g, based on the NMR measurement result.

Example 4

A composition for an encapsulant was prepared according to the same method as Example 1 except for using the compound according to Synthesis Example 4 instead of the compound according to Synthesis Example 1.

The composition for an encapsulant according to Example 4 included an epoxy group in an amount of 0.228 mmol/g, based on the NMR measurement result.

Example 5

A composition for an encapsulant was prepared according to the same method as Example 1 except for using the compound according to Synthesis Example 5 instead of the compound according to Synthesis Example 1.

The composition for an encapsulant according to Example 5 included an epoxy group in an amount of 0.2455 mmol/g, based on the NMR measurement result.

Comparative Example 1

A composition for an encapsulant was prepared according to the same method as Example 1 except for using the compound according to Comparative Synthesis Example 1 instead of the compound according to Synthesis Example 1.

The composition for an encapsulant according to Comparative Example 1 included an epoxy group in an amount of 0.08 mmol/g, based on the NMR measurement result.

Comparative Example 2

A composition for an encapsulant was prepared according to the same method as Example 1 except for using the compound according to Comparative Synthesis Example 2 instead of the compound according to Synthesis Example 1.

The composition for an encapsulant according to Comparative Example 2 included an epoxy group in an amount of 0.258 mmol/g, based on the NMR measurement result.

Evaluation

Transmittance, adhesion, luminance deterioration ratio, moisture permeability, and oxygen permeability of the compositions for an encapsulant according to Examples 1 to 5 and Comparative Examples 1 and 2 were evaluated.

The transmittance was measured by preparing each 4 mm-thick curing specimen from the compositions for an encapsulant according to Examples 1 to 5 and Comparative Examples 1 and 2, thermally curing it at 150° C. for 2 hours, and using UV-spectrophotometer (UV-3600, Shimazu Corporation)

The adhesion was evaluated in terms of die shear and peeling ratio, as follows.

A polytetrafluoroethylene spacer (width: 10 mm, length: 20 mm, thickness: 1 mm) was inserted between two silver specimens (width: 25 mm, length: 50 mm, thickness: 1 mm), each composition for an encapsulant according to Examples 1 to 5 and Comparative Examples 1 and 2 was charged in a space left between the silver specimens, and the silver specimens were fixed with a clip. Subsequently, the silver specimens were allowed to stand in a 150° C. oven for 2 hours to cure the composition. Subsequently, the silver specimens were cooled down to room temperature, put in a tension tester (3367, Instron Co.) to determine die shear after removing the clip and the spacer, and pulled toward the opposite horizontal direction to measure a stress at a moment when the specimens were broken.

The peeling ratio was obtained by dispensing the composition in a LED package to assemble them, storing the assembled LED package at 85° C. under 85 RH % for 72 hours, vaporizing moisture permeated inside the package through an IR reflow at 260° C., and measuring the number of a crack and a desorption. The encapsulant turned out to be internally colored, when the desorption occurred, and encapsulant was dipped in an ink.

The luminance deterioration ratio was obtained by measuring luminance with a spectroradiometer while an assembled LED package was supplied with a 1.5 times accelerated condition of a rated current at 85° C. under 85 RH % after dispensing the composition for an encapsulant into a LED package and assembling it and then, comparing the luminance with initial luminance.

The moisture permeability and the oxygen permeability were measured by injecting each composition according to Examples 1 to 5 and Comparative Examples 1 and 2 into a mold with a syringe, curing it at 130° C. for 5 minutes and additionally curing at 170° C. for 4 hours, and then, using a moisture permeability-measuring equipment (ASTM F-1249, ASTM D-3985) made by MOCON Inc.

The results are provided in Table 1, below.

TABLE 1

|  | Ex. 1 | Ex. 2 | Ex. 3 | Ex. 4 | Ex. 5 | Comp. Ex. 1 | Comp. Ex. 2 |
| --- | --- | --- | --- | --- | --- | --- | --- |
| Transmittance after curing (%) | 99 | 99 | 99 | 99 | 83 | 99 | 52 |
| Die shear | 3.9 | 4.5 | 6.6 | 7.2 | 7.2 | 1.8 | 7.0 |
| Peeling ratio (number) | 3/100 | 0/100 | 0/100 | 0/100 | 0/100 | 13/100 | 0/100 |
| Luminance deterioration ratio | 77 | 92 | 95 | 98 | 95 | 50 | 95 |
| Moisture permeability (gm/m² day) | 6.1 | 5.4 | 4.0 | 3.8 | 3.6 | 7.5 | 3.5 |
| Oxygen permeability (cc/m² day) | 382 | 336 | 250 | 244 | 241 | 393 | 237 |

Referring to Table 1, the compositions for an encapsulant according to Examples 1 to 5 exhibited remarkably improved luminance deterioration ratio, moisture permeability, and oxygen permeability as well as excellent permeability after curing and adhesion (in terms of die shear and peeling rate), compared with the compositions for an encapsulant according to Comparative Examples 1 and 2. For example, the composition for an encapsulant according to Comparative Example 1 exhibited a low die shear and peeling ratio and thus remarkably deteriorated adhesion and also, low luminance deterioration ratio, moisture permeability, and oxygen permeability. The composition for an encapsulant according to Comparative Example 2 exhibited improved adhesion and the like, but extremely low permeability after curing and thus, turned out to be inappropriate for an encapsulant.

An amount of an epoxy group included in an adhesion-promoting agent may have an influence on physical characteristics of an encapsulant. For example, when the adhesion-promoting agent included an epoxy group in an amount of about 2.0 to 5.0 mmol/g, transmittance, adhesion, luminance deterioration ratio, moisture permeability, and oxygen permeability of an encapsulant were simultaneously remarkably improved.

By way of summation and review, an encapsulant may be made from a composition for an encapsulant that is a transparent resin and that is able to transmit light emitted from a light emission part.

The embodiments may provide a composition for an encapsulant that is capable of increasing adherence with a lower substrate and simultaneously improving reliability.

The embodiments may help improve reliability of an encapsulant by improving adherence of the encapsulant to a lower substrate and thus, preventing detachment or delamination of the encapsulant and simultaneously, increasing heat resistance and lowering moisture permeability and oxygen permeability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an encapsulant, the composition comprising:
   at least one first polysiloxane that includes a hydrogen bound to a silicon at a terminal end thereof,
   at least one second polysiloxane that includes an alkenyl group bound to a silicon at a terminal end thereof, and
   an adhesion-promoting agent, the adhesion-promoting agent being a third siloxane represented by the following Chemical Formula 1,

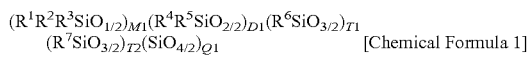

[Chemical Formula 1]

wherein, in the above Chemical Formula 1,
   $R^1$ to $R^7$ are each independently hydrogen, a hydroxy group, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, an epoxy group-containing group, a substituted or unsubstituted C1 to C30 carbonyl group, or a combination thereof, at least one of $R^1$ to $R^3$ is a hydroxy group, at least one of $R^4$ or $R^5$ is an epoxy group-containing group, at least one of $R^1$ to $R^7$ is a substituted or unsubstituted C2 to C30 alkenyl group, $0<M1<1, 0<D1<1, 0\leq T1<1, 0\leq T2<1, 0\leq Q1<1$, and $M1+D1+T1+T2+Q1=1$, wherein the first polysiloxane, the second polysiloxane, and third siloxane are each different from one another, and wherein composition includes the third siloxane in an amount such the composition includes about 0.100 to about 0.250 mmol of epoxy group per gram of the composition.

2. The composition for an encapsulant as claimed in claim 1, wherein the adhesion-promoting agent is included in the composition in an amount of about 0.5 to about 10 wt %, based on a total weight of the composition.

3. The composition for an encapsulant as claimed in claim 1, wherein the first polysiloxane is represented by the following Chemical Formula 2:

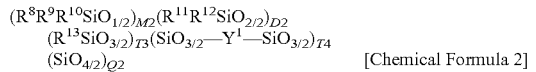

[Chemical Formula 2]

wherein, in the above Chemical Formula 2, $R^8$ to $R^{13}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^8$ to $R^{13}$ is hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M2<1, 0<D2<1, 0\leq T3<1, 0\leq T4<1, 0\leq Q2<1$, and $M2+D2+T3+T4+Q2=1$.

4. The composition for an encapsulant as claimed in claim 1, wherein the second polysiloxane is represented by the following Chemical Formula 3:

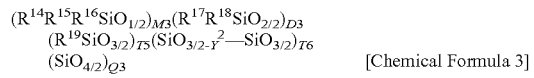

[Chemical Formula 3]

wherein, in the above Chemical Formula 3, $R^{14}$ to $R^{19}$ are each independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{14}$ to $R^{19}$ is a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M3<1, 0\leq D3<1, 0\leq T5<1, 0\leq T6<1, 0\leq Q3<1$, and $M3+D3+T5+T6+Q3=1$.

5. The composition for an encapsulant as claimed in claim 1, wherein the composition includes:

about 10 to about 40 wt % of the first polysiloxane, and about 60 to about 90 wt % of the second polysiloxane, all amounts being based on a total weight of the composition for an encapsulant.

6. An encapsulant obtained by curing the composition for an encapsulant as claimed in claim 1.

7. An electronic device comprising the encapsulant as claimed in claim 6.

8. The composition for an encapsulant as claimed in claim 1, wherein at least one of $R^4$ to $R^7$ is a substituted or unsubstituted C6 to C30 aryl group, the at least one of $R^4$ to $R^7$ that is the substituted or unsubstituted C6 to C30 aryl group being different from the at least one of $R^4$ or $R^5$ that is the epoxy group-containing group.

* * * * *